(12) United States Patent
Sumant et al.

(10) Patent No.: US 10,186,584 B2
(45) Date of Patent: Jan. 22, 2019

(54) SYSTEMS AND METHODS FOR FORMING DIAMOND HETEROJUNCTION JUNCTION DEVICES (71) Applicant: UChicago Argonne, LLC, Chicago, IL (US)

(72) Inventors: Anirudha V. Sumant, Plainfield, IL (US); Kiran Kumar Kovi, Lemont, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 15/240,594

(22) Filed: Aug. 18, 2016

(65) Prior Publication Data
US 2018/0053827 A1  Feb. 22, 2018

(51) Int. Cl.
H01L 21/02 (2006.01)
H01L 29/267 (2006.01)
H01L 21/04 (2006.01)
H01L 21/441 (2006.01)
H01L 29/861 (2006.01)
H01L 29/66 (2006.01)
H01L 29/45 (2006.01)
H01L 29/04 (2006.01)

(52) U.S. Cl.
CPC .......... *H01L 29/267* (2013.01); *H01L 21/043* (2013.01); *H01L 21/441* (2013.01); *H01L 29/6603* (2013.01); *H01L 29/861* (2013.01); *H01L 21/0217* (2013.01); *H01L 21/02112* (2013.01); *H01L 21/02164* (2013.01); *H01L 21/02178* (2013.01); *H01L 29/04* (2013.01); *H01L 29/45* (2013.01)

(58) Field of Classification Search
CPC . H01L 2224/48091; H01L 2924/00014; H01L 21/28506; H01L 21/288; H01L 21/32055; H01L 21/3215; H01L 29/1606; H01L 29/413; H01L 29/45; H01L 29/454; H01L 29/456; H01L 29/786; H01L 29/78681
See application file for complete search history.

(56) References Cited

U.S. PATENT DOCUMENTS

| 5,039,626 A * | 8/1991 | Koma | C30B 23/02 117/8 |
|---|---|---|---|
| 2005/0119136 A1 | 6/2005 | Castle | |
| 2006/0022191 A1 * | 2/2006 | Bakkers | B82Y 10/00 257/40 |
| 2006/0222869 A1 | 10/2006 | Cai et al. | |
| 2009/0159880 A1 | 6/2009 | Honda et al. | |

(Continued)

OTHER PUBLICATIONS

Lee et al., Growth and Electrical Characterization of Two-Dimensional Layered MoS2/SiC Heterojunctions, Applied Physics Letters 105, 2004, 5 pages.

*Primary Examiner* — Jaehwan Oh
(74) *Attorney, Agent, or Firm* — Foley & Lardner LLP (57) ABSTRACT A method of forming a p-n junction device comprises providing a base layer including a p-type diamond. A monolayer or few layer of a transition metal dichalcogenide (TMDC) is disposed on at least a portion of the base layer so as to form a heterojunction therebetween. The TMDC monolayer is an n-type layer such that the heterojunction between the intrinsic and p-type diamond base layer and the n-type TMDC monolayer is a p-n junction.

18 Claims, 9 Drawing Sheets (56) References Cited

U.S. PATENT DOCUMENTS

| | | | |
|---|---|---|---|
| 2013/0105824 A1* | 5/2013 | Paranjape | H01L 31/032 257/86 |
| 2014/0097459 A1 | 4/2014 | Motohara | |
| 2015/0004733 A1* | 1/2015 | Wang | C01B 19/007 438/54 |
| 2015/0108500 A1 | 4/2015 | Irsigler et al. | |
| 2016/0284811 A1* | 9/2016 | Yu | H01L 29/454 |
| 2016/0340533 A1* | 11/2016 | Casiraghi | C01B 21/0648 |

* cited by examiner

SYSTEMS AND METHODS FOR FORMING DIAMOND HETEROJUNCTION JUNCTION DEVICES

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to methods for fabricating diamond semi-conductor devices.

BACKGROUND

High-speed and high-power semiconductor device, are in great demand in the telecommunication, power electronics, and solar inverter industries. The insatiable consumer demand for cutting-edge high-speed product features creates opportunities for enabling technologies in the telecommunications industry. In addition, the high-power/frequency devices have many applications such as in microwave power amplifiers that are widely used in civilian and military electronics. The increase of power density and performance while simultaneously decreasing cost is a constant trend in the power semiconductor world.

Diamond has exceptional material attributes such as high thermal conductivity, breakdown voltage and carrier mobility, amongst other favorable enabling properties which make it a favorable candidate for next-generation power electronics devices. However, high costs associated with diamond, as well as technological issues such as achieving n-type doping have kept diamond-based semiconductor devices from being commonly employed.

SUMMARY

Embodiments described herein relate generally to diamond semi-conductor devices and, in particular to diamond based p-n junction devices that include a two dimensional transition metal dichalcogenide (TMDC) and methods of fabricating the same.

In some embodiments, a method of forming a p-n junction device comprises providing a base layer including a p-type diamond. A monolayer of a transition metal dichalcogenide (TMDC) is disposed on at least a portion of the base layer so as to form a heterojunction therebetween. The TMDC monolayer is an n-type layer such that the heterojunction between the p-type diamond base layer and the n-type TMDC monolayer is a p-n junction.

In some embodiments, a p-n junction device comprises a base layer comprising a p-type diamond. A monolayer of a transition metal dichalcogenide (TMDC) is disposed on at least a portion of the base layer. The TMDC monolayer and the base layer form a heterojunction therebetween. Moreover, the TMDC monolayer is an n-type layer so that the heterojunction is a p-n junction.

In some embodiments, a method of forming a p-n junction device comprises providing a base layer including a p-type diamond. A monolayer of a metal dichalcogenide (TMDC) is disposed on at least a portion of the base layer. An insulating layer is disposed on the TMDC monolayer and the base layer. The insulating layer is patterned so as to expose at least a portion of the TMDC monolayer and the base layer. A masking layer is disposed over the insulating layer and the TMDC layer. The masking layer is patterned so as to expose at least a portion of the TMDC monolayer and the base layer. A conducting layer is disposed on the masking layer so as to contact the exposed portion of the TMDC layer. The masking layer is removed thereby removing only a portion of the conducting layer disposed on the masking layer. The TMDC monolayer is an n-type layer such that the heterojunction between the p-type diamond base layer and the n-type TMDC monolayer is a p-n junction.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to diamond semi-conductor devices and, in particular to diamond based p-n junction devices that include a two dimensional transition metal dichalcogenide (TMDC) and methods of fabricating the same.

High-speed and high-power semiconductor devices are in great demand in the telecommunication, power electronics, and solar inverter industries. The insatiable consumer demand for leading-edge high-speed product features creates opportunities for enabling technologies in the telecommunications industry. In addition, the high-power/frequency devices have many applications in microwave power amplifiers that are widely used in civilian and military electronics. The increase of power density and performance while simultaneously decreasing cost is a constant trend in the power semiconductor world.

While silicon is still the most popular semi-conductor material, wide band gap semiconductor materials such as silicon carbide and gallium nitride are of interest because of their superior material properties. However, processing issues and manufacturing costs associated with these materials create hurdles for replacing silicon with these materials.

Diamond has exceptional material attributes such as high thermal conductivity, breakdown voltage and carrier mobility, amongst other favorable enabling properties which make it a favorable candidate for next-generation power electronics devices. For example, diamond has high thermal conductivity, excellent radiation hardness, high temperature stability, low leakage current, high frequency and high power handling capability to name a few.

Although progress in chemical vapor deposition (CVD) technology has allowed fabricating large size (e.g., 7.5 mm to 7.5 mm) single crystal diamond wafers, it is difficult to n-dope diamond which is key to forming semi-conductor devices. Some process which use in-situ doping of phosphorus during homoepitaxial growth (with moderate doping concentration of 1,018 $cm^{-3}$ and mobility of 100 $cm^2/V\text{-}s$ operating at 150 degrees Celsius) or with delta doping method of confining dopant layer within few nm to achieve high carrier concentration and mobility at room temperatures, are very complex and challenging and not readily amenable to large scale manufacturing processes.

Embodiments of diamond-TMDC p-n junction devices and methods of forming the same may provide several benefits including, for example: (1) providing a monolayer of a TMDC on a p-doped diamond which serves as a n-type "delta doped layer," thereby eliminating the use of complex procedures for doping a few nm thick layer of the p-doped diamond with high n-doping concentration; (2) enabling an excellent atomic interface between the TMDC and diamond via van der Waal's interaction of the 2-dimensional TMDC monolayer with the p-doped diamond; (3) enhancing the already superior current density provided by TMDC materials (e.g., $MoS_2$ having a current density of about $10^7$ amperes per $cm^2$) by contacting the TMDC with the high thermal conductivity diamond; (4) easily scalable to wafer scale, thereby allowing manufacturing of semi-conductor devices on a large scale; and (5) finding applications in several semi-conductor applications such as photodetectors, rectifiers, solar cells, transistors, etc.

As used herein, the term "single crystal diamond (SCD)" refers to monocrystalline diamond without any grain boundaries, and "nanocrystalline diamond (NCD)" refers to crystalline diamond that has a grain size in the range of 10 nm to 200 nm, and the term "ultrananocrystalline diamond (UNCD)" refers to crystalline diamond that has a grain size in the range of 2 nm to 10 nm. Polycrystalline diamond may be nanocrystalline or ultrananocrystalline. "Mono layer" means a single layer. "Few layer" means at least two and at most 10 layers and ranges inclusive therein.

Figure 1:
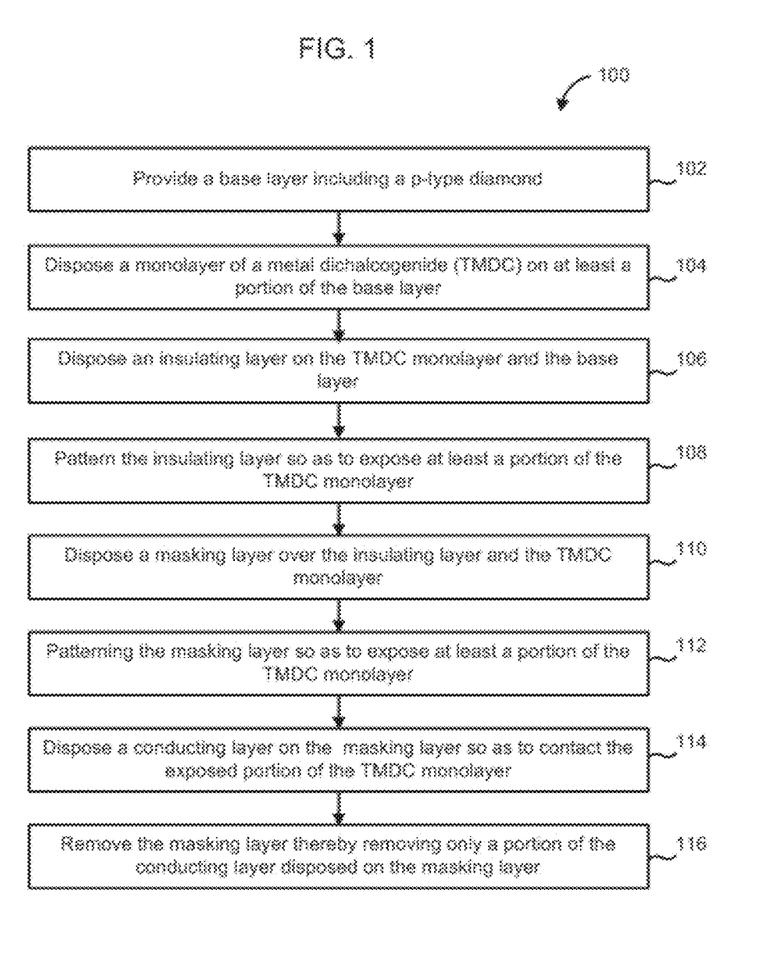
FIG. 1 is a schematic flow diagram of an example method of fabricating a diamond p-n junction device.

FIG. 1 is a schematic flow diagram of an example method 100 for forming a p-n junction device. The method 100 includes providing a base layer including a p-type diamond at 102. For example, the base layer can include intrinsic or a p-doped SCD, p-doped NCD or a p-doped UNCD. The base layer may have any suitable shape or size. For example, the base layer may include a diamond wafer (e.g., a 7.5 mm×7.5 mm SCD wafer), a diamond film, a diamond block or any other shape and size. Furthermore, the base layer may include a single crystal diamond or a polycrystalline diamond.

In some embodiments, the base layer may include a diamond (e.g., intrinsic or a p-type SCD, NCD or a p-type UNCD diamond) deposited on a substrate. The substrate can have any shape or size (e.g., a sheet, a block, a wafer, etc.) and can be formed from any suitable material such as, silicon, silicon carbide, glass, quartz, Pyrex, metals, polymers, oxides, etc. In such embodiments, the diamond may be deposited on the substrate using any suitable process (e.g., a microwave plasma chemical vapor deposition process).

The diamond base layer may have any suitable thickness. In some embodiments, the diamond base layer may have a thickness in the range of 1 micron to a 1,000 microns inclusive of all ranges and values therebetween. In other embodiments, the diamond base layer may have a thickness in the range of 50 nms to about 150 nms (e.g., about 50 nms, 60 nms, 70 nms, 80 nms, 90 nms, 100 nms, 110 nms, 120 nms, 130 nms, 140 nms, or about 150 nms inclusive of all ranges and values therebetween). In some embodiments, the diamond base layer may have a root mean square (RMS) roughness of less than 10 nms. In particular embodiments, the diamond base layer may be sufficiently thin so as to have a transparency of greater than about 90%, for example, 91%, 92%, 93%, 94%, 95%, 96%, 97%, 98% or about 99%.

As described before, the base layer includes intrinsic or a p-type diamond. In some embodiments, the diamond may be doped with a p-type dopant. Any suitable p-type dopant may be used, for example boron. Doping of the base layer with the p-type dopant may be performed using any suitable process. For example, the p-type dopant may be implanted in the diamond base layer which may be annealed thereafter.

In other embodiments, the diamond may be doped with the p-type dopant during the diamond deposition process. For example, the p-type dopant (e.g., boron) may be introduced during the diamond deposition process (e.g., a boron gas introduced into a microwave plasma chamber used to deposit the diamond base layer on the substrate) so as to incorporate atoms of the p-type dopant into the diamond deposited on the substrate.

A monolayer or few layer (such as 2-10, in one embodiment, and ranges inclusive therein in other embodiments) of a TMDC is disposed on at least a portion of the base layer at 104. Deposition may be by mechanical or chemical exfoliation or by a deposition technique such as CVD or ALD. The TMDC monolayer forms a heterojunction with the diamond base layer. The TMDC includes an n-type layer such that the heterojunction between the p-type diamond base layer and the n-type TMDC monolayer forms a p-n junction, thereby yielding the p-n junction device. The TMDC may include any material having the chemical formula:

$$MX_2$$

where M is a transition metal such as molybdenum, scandium, titanium, tungsten, chromium, manganese, iron, cobalt, nickel, copper, zinc, vanadium, or any other transition metal, and X is a chalcogen atom, for example sulfur, selenium, tellurium, oxygen or polonium.

For example, the TMDC monolayer may include molybdenum disulfide ($MoS_2$). $MoS_2$ is a direct band-gap material when it is in monolayer form, and has a bandgap of about 1.9 electron Volts (eV). It is naturally n-type material with carrier mobilities which may be as high as 450 $cm^2/V$-s. It has a high current density of about $5 \times 10^7$ amperes per $cm^2$, which may be extended even further on the high thermal conductivity diamond base layer. It is stable at high temperature, has stiffness greater than steel, and is flexible and transparent. Moreover, $MoS_2$ may demonstrate ambipolar characteristics which are suitable for forming electronic devices.

A monolayer of $MoS_2$ may be about 1 nm thick and essentially mimics an ultrathin delta doped n-type layer on diamond. Therefore, depositing the n-type $MoS_2$ monolayer or any other TMDC monolayer on the diamond base layer may result in a p-n junction between the TMDC (e.g., $MoS_2$) and the diamond. The atomically thin TMDC monolayer provides pristine surface quality and lacks dangling bonds. The van der Waal's interaction between the TMDC monolayer and the diamond base layer forms the heterojunction which has a perfect atomic interface between the diamond base layer and the TMDC monolayer so as to result in an effective p-n junction.

The TMDC monolayer or few layer may be disposed on the diamond base layer using any suitable method. In some embodiments, the TMDC monolayer may be disposed using mechanical exfoliation. For example, the TMDC monolayer may be exfoliated from a bulk $MoS_2$ (e.g., via scotch tape mechanical exfoliation). The exfoliated layer is then transferred to the diamond substrate. In other embodiments, the $MoS_2$ may be deposited using chemical vapor deposition (CVD), sputtering, thermal evaporation, electron beam evaporation, atomic layer deposition (ALD), chemical self-assembly or any other suitable method.

In some embodiments, an insulating layer may be disposed on the base layer and the TMDC monolayer at 106. The insulating layer may include aluminum oxide, hexagonal boron nitride, silicon oxide, silicon nitride or any other suitable insulating material. The insulating layer may be disposed on the base layer and the TMDC monolayer using any method, for example CVD, ALD, sputtering, spin coating, chemical self-assembly or any other suitable method. The insulating layer may have any suitable thickness, for example in the range of 1 nm to 100 nm inclusive of all ranges and values therebetween (e.g., about 50 nm). In particular embodiments, the insulating layer may have a sub-nanometer thickness.

The insulating layer is patterned so as to expose at least a portion of each of the TMDC monolayer and the base layer at 108. For example, the insulating layer may be patterned using a combination of photolithography and etching (e.g., plasma etching or chemical etching), nanolithography, using a virtual mask (e.g., a computer generated mask pattern for patterning using e-beam lithography), e-beam lithography, ion-beam lithography or any other patterning method or a combination thereof. In some embodiments, the exposed portion of the insulating layer and the base layer may serve to provide electrical contacts to each of the p-type base layer and the n-type TMDC monolayer which form the p-n junction.

In some embodiments, a conducting layer may be disposed on the exposed portions of the TMDC monolayer and the diamond base layer so as to provide electrical contacts for interfacing the p-n junction device with external electronics. For example, the method 100 may include disposing a masking layer over the TMDC monolayer and the diamond base layer at 110. The masking layer may include, for example a positive photoresist (e.g., any of the AZ® series photoresists, phenolic resins, etc.) negative photoresists (e.g., SU-8, AZ® nLOF 2000 series, e-beam photoresists) or any other masking layer. The masking layer may be deposited via spin coating, spray coating, vapor deposition or any other suitable method.

The masking layer is patterned so as to expose the portions of the diamond base layer and the TMDC monolayer which do not have the insulating layer disposed thereon at 112. For example, the masking layer may be patterned using a photolithography, e-beam lithography, physical etching, chemical etching, nanoimprint lithography, any other method or combination thereof. The patterning thereby removes the mask from the portions of the diamond base layer and the TMDC monolayer which do not have the insulating layer disposed thereon.

A conducting layer is disposed on the masking layer at 114. The conducting layer may form a film which contacts the exposed portions of the TMDC monolayer and the diamond base layer but is disposed on the masking layer at other portions of the film. The conducting layer may include any suitable conductive layer which can form a strong electrical coupling with the TMDC and the diamond base layer. For example, the conducting layer may include nickel, titanium, gold, platinum, 1T phase molybdenum disulfide, graphene or any other suitable conducting layer.

The masking layer is removed so as to lift-off or remove only the portion of the conducting layer disposed on the masking layer at 116. This leaves the conducting layer disposed on in contact with the exposed portions of the TMDC monolayer and the diamond base layer. The conducting layer may be used to form contacts with external electronics.

Figure 2:
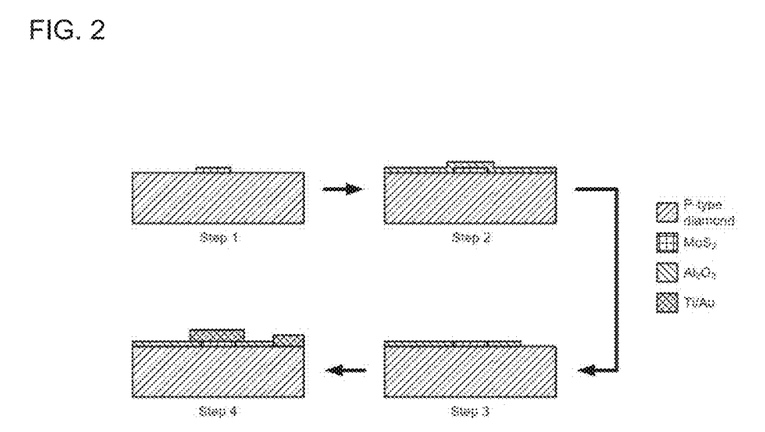
FIG. 2 is a schematic block diagram of a process flow of another method of fabricating a diamond p-n junction device.

FIG. 2 is a schematic block diagram of a process for forming a particular p-n junction device. At step 1 a base layer including a p-type diamond is provided and a $MoS_2$ monolayer is disposed on a portion of the base layer. The p-type diamond may include a p-type NCD or a p-type UNCD. The base layer may have any suitable shape or size. For example, the base layer may include a diamond wafer (e.g., a 7.5 mm×7.5 mm diamond wafer), a diamond film, a diamond block or any other shape and size. Furthermore, the base layer may include a single crystal diamond or a polycrystalline diamond.

The diamond base layer may have any suitable thickness. In some embodiments, the diamond base layer may have a thickness in the range of 1 micron to a 1,000 microns inclusive of all ranges and values therebetween. In other embodiments, the diamond base layer may have a thickness in the range of 50 nms to about 150 nms (e.g., about 50 nms, 60 nms, 70 nms, 80 nms, 90 nms, 100 nms, 110 nms, 120 nms, 130 nms, 140 nms, or about 150 nms inclusive of all ranges and values therebetween). In some embodiments, the diamond base layer may have a root mean square (RMS) roughness of less than 10 nms. In particular embodiments, the diamond base layer may be sufficiently thin so as to have a transparency of greater than about 90%, for example, 91%, 92%, 93%, 94%, 95%, 96%, 97%, 98% or about 99%.

The monolayer or few layers of $MoS_2$ may be about 1-10 nm thick and essentially mimics an ultrathin delta doped n-type layer on diamond. The n-type $MoS_2$ layer forms a heterogeneous interface with the p-type diamond layer, thereby forming a p-n junction therebetween. The van der Waal's interaction between the TMDC monolayer and the diamond base layer forms a heterojunction having a perfect atomic interface between the diamond and the TMDC so as to result in a high quality p-n junction.

The $MoS_2$ monolayer may be deposited on the diamond base layer using any suitable method. In some embodiments, the $MoS_2$ monolayer may be disposed using mechanical exfoliation. For example, the $MoS_2$ monolayer may be exfoliated from a bulk $MoS_2$ (e.g., via scotch tape mechanical exfoliation). The exfoliated layer is then transferred to the diamond substrate. In other embodiments, the $MoS_2$ may be deposited using chemical vapor deposition (CVD), sputtering, thermal evaporation, electron beam evaporation, atomic layer deposition (ALD), chemical self-assembly or any other suitable method.

At step 2, an aluminum oxide ($Al_2O_3$) insulating layer is disposed on the base layer and the TMDC monolayer. In other embodiments, the insulating layer may include hexagonal boron nitride, silicon oxide, silicon nitride or any other suitable insulating material. The insulating layer may be disposed on the base layer and the $MoS_2$ monolayer using any method, for example CVD, ALD, sputtering, spin coating, chemical self-assembly or any other suitable method. The insulating layer may have any suitable thickness, for example in the range of 1 nm to 100 nm inclusive of all ranges and values therebetween. In some embodiments, the $Al_2O_3$ insulating layer has a thickness of about 50 nm. In particular embodiments, the insulating layer may have a sub-nanometer thickness.

At step 3, the $Al_2O_3$ insulating layer is patterned so as to expose at least a portion each of the TMDC monolayer and the diamond base layer. For example, the insulating layer may be patterned using a combination of photolithography and etching (e.g., plasma etching or chemical etching), nanolithography, using a virtual mask (e.g., a computer generated mask pattern for patterning using e-beam lithography), e-beam lithography, ion-beam lithography or any other patterning method or a combination thereof.

In particular embodiments, the insulating layer includes $Al_2O_3$ which is patterned using a combination of photolithography (e.g. using a positive or negative photoresist) and wet etching with buffered hydrofluoric acid (BHF). The exposed portion of the insulating layer and the diamond base layer may serve to provide electrical contacts to each of the p-type base layer and the n-type TMDC monolayer which form the p-n junction.

At step 4, a titanium/gold (Ti/Au) conducting layer is disposed on the exposed portions of the TMDC monolayer and the diamond base layer so as to provide electrical contacts for interface of the p-n junction device with external electronics. For example, a masking layer may be disposed over the $MoS_2$ monolayer and the p-type diamond base layer. The masking layer may include, for example a positive photoresist (e.g., any of the AZ® series photoresists, phenolic resins, etc.) negative photoresists (e.g., SU-8, AZ® nLOF 2000 series, e-beam photoresists) or any other masking layer. The masking layer may be deposited via spin coating, spray coating, vapor deposition or any other suitable method.

The masking layer is patterned so as to expose the portions of the base layer and the $MoS_2$ monolayer which do not have the insulating layer disposed thereon. The masking layer may be patterned using a photolithography, e-beam lithography, physical etching, chemical etching, nanoimprint lithography, any other suitable method or combination thereof.

The Ti/Au conducting layer is then disposed on the masking layer. The Ti/Au conducting layer may form a film which contacts the exposed portions of the $MoS_2$ and the p-type base layer but is disposed on the masking layer at other portions of the film. The Ti/Au conducting layer may include an suitable conductive material which can form a strong electrical contact with the $MoS_2$ and the p-type diamond base layer. In other embodiments, the conducting layer may include any other conducting material, for example nickel, platinum, 1T phase molybdenum disulfide, graphene or any other suitable conducting layer.

The masking layer is removed so as to lift-off or remove only the portion of the Ti/Au conducting layer disposed on the masking layer. This leaves the Ti/Au conducting layer disposed on and in contact with the exposed portions of the $MoS_2$ monolayer and the p-type diamond base layer. The Ti/Au conducting layer may be used to form contacts with external electronics.

Figure 3:
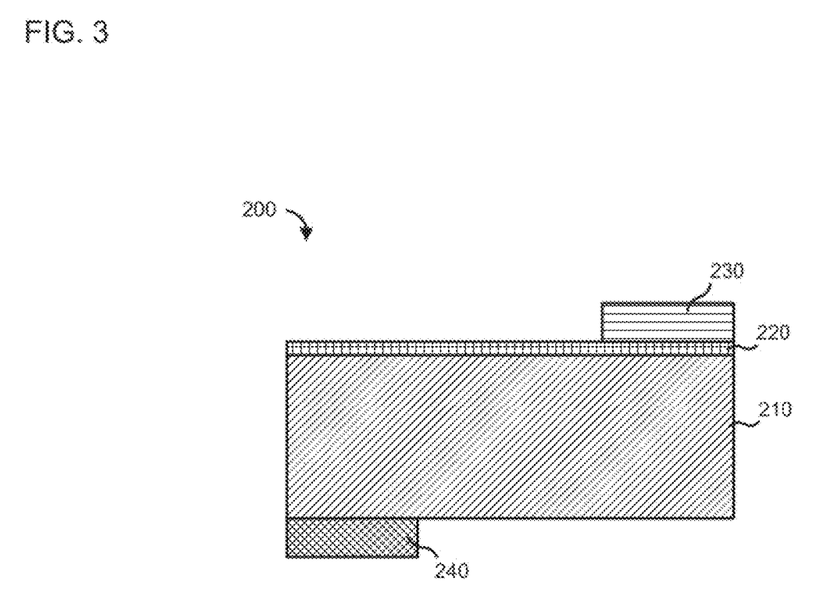
FIG. 3 is a schematic illustration of a side cross-section of a p-n junction device according to an embodiment.

FIG. 3 is a schematic illustration of a side cross-section of a p-n junction device 200 according to an embodiment. The p-n junction device 200 may be formed using any of the methods described herein, for example the method 100. Furthermore, the p-n junction device 200 may be used in or form a sub-component of any semi-conductor device such as solar cells, photocells, rectification diodes, tunnel diodes, zener diodes, LEDs, PIN diodes, transistors, metal oxide semi-conductor field effect transistors (MOSFET), sensors (e.g., Hall effect sensors), integrated circuits, charge coupled devices (CCDs), ROMs, RAMs, etc.

The p-n junction device 200 includes a base layer 210. The base layer 210 includes a p-type diamond, for example a p-type NCD or a p-type UNCD. The base layer 210 may have any suitable shape or size. For example, the base layer 210 may include a diamond wafer (e.g., a 7.5 mm×7.5 mm diamond wafer), a diamond film, a diamond block or any other shape and size. Furthermore, the base layer 210 may include a single crystal diamond or a polycrystalline diamond.

The base layer 210 may have any suitable thickness. In some embodiments, the base layer 210 may have a thickness in the range of 1 micron to a 1,000 microns inclusive of all ranges and values therebetween. In other embodiments, the base layer 210 may have a thickness in the range of 50 nms to about 150 nms (e.g., about 50 nms, 60 nms, 70 nms, 80 nms, 90 nms, 100 nms, 110 nms, 120 nms, 130 nms, 140 nms, or about 150 nms inclusive of all ranges and values therebetween). In particular embodiments, the diamond base layer 210 may be sufficiently thin so as to have a transparency of greater than about 90%, for example, 91%, 92%, 93%, 94%, 95%, 96%, 97%, 98% or about 99%. While not shown, in some embodiments, the base layer 210 may be disposed on a substrate such as, silicon, glass, quartz, Pyrex, metals, polymers, oxides or any other suitable substrate.

A TMDC monolayer 220 is disposed on the base layer 210. The TMDC monolayer 220 forms a heterojunction with the base layer 210. The TMDC monolayer 220 includes an n-type layer such that the heterojunction between the base layer 210 and the TMDC monolayer 220 forms a p-n junction, thereby yielding the p-n junction device 200. The TMDC monolayer 220 may include any material having the chemical formula:

$$MX_2$$

where M is a transition metal such as molybdenum, scandium, titanium, tungsten, chromium, manganese, iron, cobalt, nickel, copper, zinc, vanadium, or any other transition metal, and X is a chalcogen atom, for example sulfur, selenium, tellurium, oxygen or polonium.

The TMDC monolayer 220 may be about 1 nm thick and essentially mimics an ultrathin delta doped n-type layer on diamond. The TMDC monolayer 220 may be deposited on the diamond base layer 210 using any suitable method, for example as described with respect to the method 100.

A first contact pad 230 is disposed on at least a portion of the TMDC monolayer 220 and in electrical communication thereto. A second contact pad 240 is disposed on a second surface of the base layer 210 opposite the TMDC monolayer 220, and in electrical communication with the base layer 210. The first contact pad 230 and the second contact pad 240 may allow electrical coupling of the TMDC monolayer 220 and the base layer 210 with external electronics.

FIG. 3 shows the second contact pad 240 disposed on the second surface of the base layer 210. In some embodiments, the second contact pad 240 may be disposed on a first surface of the base layer 210 on which the TMDC monolayer 220 is disposed. The first contact pad 230 and the second contact pad 240 may be disposed on the TMDC monolayer 220 and the base layer 210 using any suitable method, for example as described with respect to the method 100.

The first contact pad 230 and the second contact pad 240 may include an suitable conductive layer which can form a strong electrical coupling with the TMDC monolayer 220 and the p-type diamond base layer 210. For example, the first contact pad 230 and the second contact pad 240 may include nickel, titanium, gold, platinum, 1T phase molybdenum disulfide, graphene or any other suitable conducting material.

In particular embodiments, an insulating layer may also be disposed on the exposed portions of the TMDC monolayer 220 and/or the base layer 210. The insulating layer may include aluminum oxide, hexagonal boron nitride, silicon oxide, silicon nitride or any other suitable insulating material. The insulating layer may be disposed on the diamond base layer 210 and the TMDC monolayer 220 using any method, for example CVD, ALD, sputtering, spin coating, chemical self-assembly or any other suitable method as described with respect to the method 100. The insulating layer may have any suitable thickness, for example in the range of 1 nm to 100 nm inclusive of all ranges and values therebetween (e.g., about 50 nm). In particular embodiments, the insulating layer may have a sub-nanometer thickness.

Figure 4A:
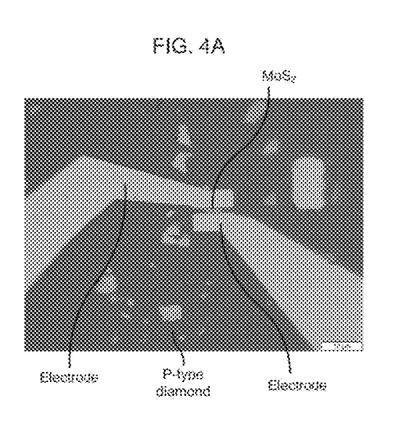
FIG. 4A is an optical image of a p-n junction device that includes a molybdenum disulfide ($MoS_2$) n-type layer positioned over a diamond substrate and contacted by electrodes.
Figure 4B:
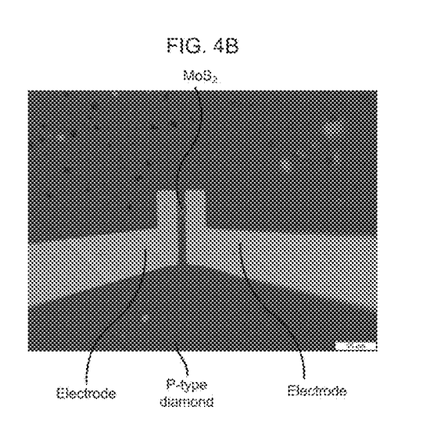
FIG. 4B is an enlarged optical image of a portion of the p-n junction device of FIG. 4A.

FIG. 4A is an optical image of a p-n junction device that includes a molybdenum disulfide ($MoS_2$) n-type layer positioned over a diamond substrate and contacted by electrodes, and FIG. 4B is an enlarged optical image of a portion of the p-n junction device of FIG. 4A. The p-n junction device includes a pair of Ti/Au electrodes disposed on a p-type diamond substrate. The electrodes are separated by a small gap between which a $MoS_2$ flake is disposed.

The $MoS_2$ flake shown in FIGS. 4A-B is disposed using mechanical exfoliation. In other embodiments, the $MoS_2$ flake may be disposed using CVD or any other suitable method as described herein. At least one of the pair of electrodes is in contact with the $MoS_2$ flake, while the other electrode is in contact with the p-type diamond substrate. The $MoS_2$ flake is a monolayer thick (e.g., having a thickness of about 1 nm) and is inherently n-type such that the $MoS_2$ forms a delta doped p-n heterojunction with the p-type diamond.

Figure 5A:
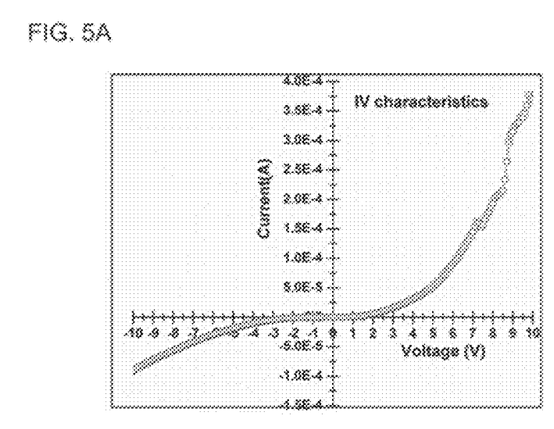
FIG. 5A is a current-voltage (I-V) plot of a first p-n diode that includes an ultrananocrystalline diamond (UNCD)-$MoS_2$ p-n junction.
Figure 5B:
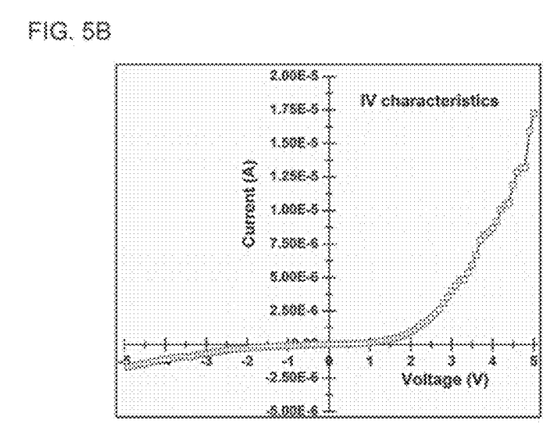
FIG. 5B is an I-V curve of a second p-n diode that also includes a UNCD-$MoS_2$ p-n junction.

Various devices similar to the device shown in FIGS. 4A-B were fabricated which included a UNCD base layer and a $MoS_2$ monolayer disposed thereon so as to form a p-n diode. I-V characteristics of the p-n diodes were determined. FIG. 5A is an I-V plot of a first p-n diode which includes a p-type UNCD base layer and $MoS_2$ monolayer disposed thereon. The first p-n diode had a rectification ratio of 5 at a biasing voltage of 9 Volts and an ideality factor "n" close to 60. FIG. 5B is an I-V plot of a second p-n diode which includes a p-type UNCD base layer and a $MoS_2$ monolayer disposed thereon. The second p-n diode had a rectification ratio of 10 at a biasing voltage of 4 Volts and an ideality factor "n" close to 40. It should be appreciated that the current density and rectification ratios for NCD, UNCD, and SCD differ.

Figure 6A:
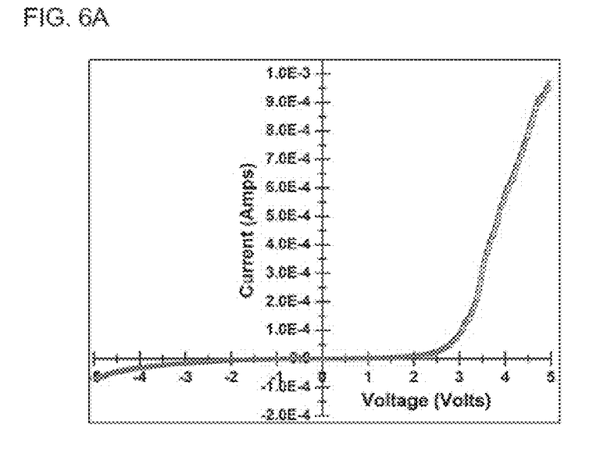
FIG. 6A is an I-V curve a third p-n diode that includes a UNCD-$MoS_2$ p-n junction.
Figure 6B:
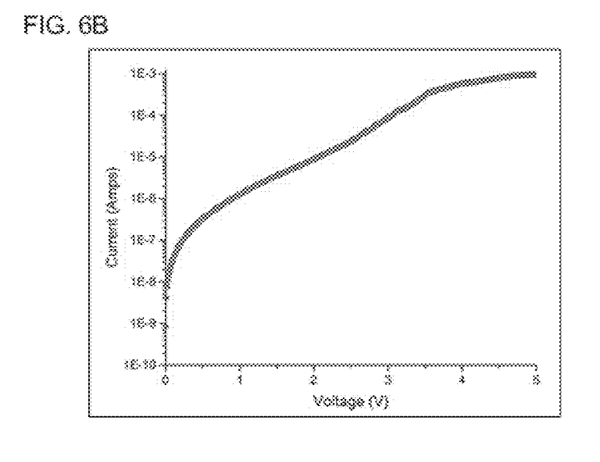
FIG. 6B is semi-log I-V curve of the third p-n diode.

FIG. 6A is an I-V plot of a third p-n diode which includes a p-type UNCD base layer and $MoS_2$ monolayer. The third p-n diode ha a rectification ratio of 15 at a biasing voltage of 5 Volts and an ideality factor n of about 14. FIG. 6B is a semi-log I-V plot of the third p-n diode.

Figure 7:
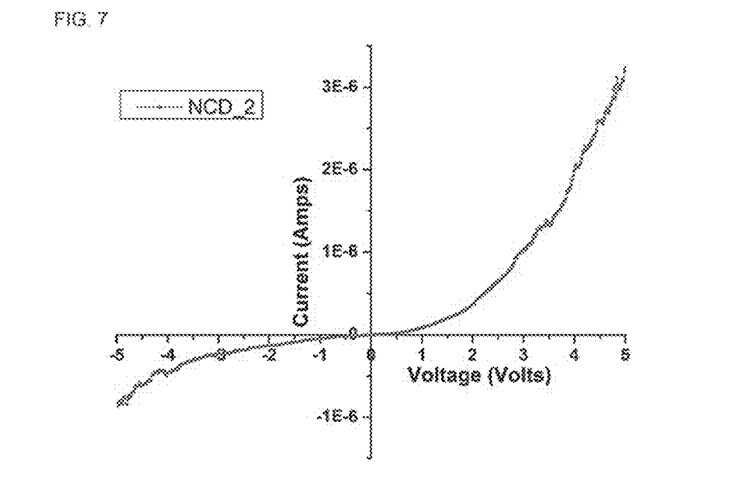
FIG. 7 is an I-V curve of a fourth p-n diode that includes a nanocrystalline diamond (NCD)-$MoS_2$ p-n junction.

FIG. 7 is an I-V plot of a fourth p-n diode which includes a p-type NCD base layer and a $MoS_2$ monolayer. The fourth p-n diode had a rectification ratio of 5 at a biasing voltage of 5 Volts and an ideality factor n of about 70.

EXPERIMENTS

In order to study the formation of p-n junctions, experiments described below were undertaking. The general technique is shown in FIG. 1 and FIG. 2.

Figure 8:
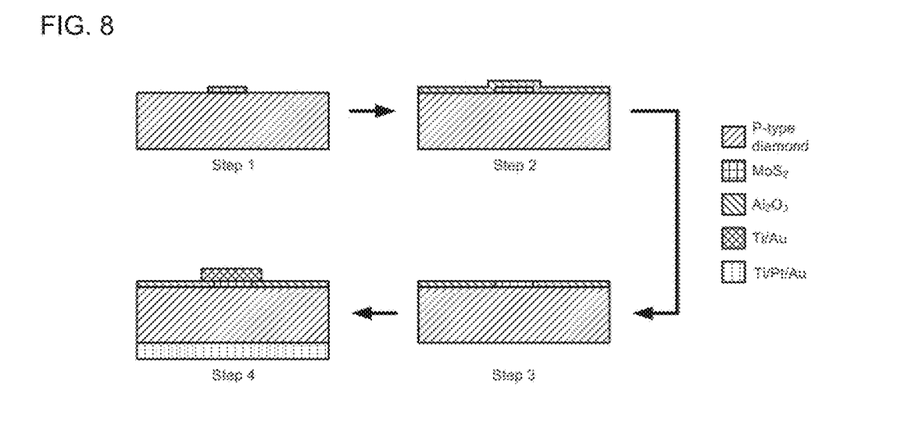
FIG. 8 illustrates a device fabrication flow where bulk pn junctions are formed on SC-CVD diamond sample in contrast to the B-UNCD fabrication flow of FIG. 2

The $MoS_2$ flakes are mechanically exfoliated using a scotch tape onto the B-doped nanocrystalline diamond (NCD) and B-doped single crystalline-chemical vapor deposited (SC-CVD) diamond samples. The NCD has resistivity of 9.25E-2 Ohms-cm and sheet resistance of 9.86E2 Ohms/square and B-doped SC-CVD diamond has a doping concentration of 2.1E15/cm3. The exfoliated flakes on diamond suitable for device fabrication are identified and characterized using: optical microscopy, Raman spectroscopy, AFM and SEM. Aluminum oxide with thickness of 50 nm is deposited on the whole sample using atomic layer deposition (ALD) to act as passivation layer. A laser pattern generator (photolithography) is used to pattern to etch the $Al_2O_3$ on the identified flakes for metallization. Ti/Au contacts are deposited by using e-beam evaporation after an additional step of lithography. FIG. 2 illustrates the B-UNCD formation method utilized for comparative purposes. The B-SC-CVD device fabrication flow is shown in FIG. 8. Lateral pn junctions are fabricated on NCD substrates, while bulk pn junctions are formed on SC-CVD diamond sample. In some embodiments, a back contact of Ti/Pt/Au is deposited. In one particular embodiment, the Ti/Pt/Au contact has thickness of 10/10/80 nm and is deposited using e-beam evaporation.

The integration of 2D materials with diamond (3D) by forming a heterojunction was studied experimentally. Further studies are required for a detailed understanding of the transport phenomena at the interface. This can be further studied by addressing the issues such as series resistance, improving the contacts on 2D $MoS_2$ and diamond substrates. However, the initial results are encouraging towards fabrication of 2D/3D heterojunction devices by integrating p-type diamond with n-type 2D $MoS_2$. A more detailed study is done on SC-CVD diamond sample by employing different contacts on the $MoS_2$ flakes. Contacts such as graphene/Pd/Au and Ni/Au are deposited. For graphene deposition, a transfer method using PMMA is used. The geometry of the device can be seen in FIG. 9B.

RESULTS AND DISCUSSION

The IV curves obtained are shown in FIG. 10A-12B. A strong rectification behavior can be observed from the curves. The rectification ratio is calculated as close to 15 with an ideality factor calculated from the diode equation is around 14 for the NCD/$MoS_2$ structures. Although the ideality factor is high, the results are still encouraging enough for preliminary studies. The high ideality factor is due to the recombination current arising from defects/traps at the interface, high series resistance from the substrate and high contact resistance on $MoS_2$ layers.

For the SC-CVD diamond/$MoS_2$ structures with Ti/Au contacts, a rectification ratio of 211, ideality factor of 14 and current density: 102 Amps/$cm_2$ were observed at 8 V. CV measurements for this structure are plotted in FIG. 11c. The measurements were made at different frequencies and high frequency dispersion is observed indicating interface states and a high series resistance. These measurements also reflect the high ideality factor calculated from the IV curves. Furthermore, by changing the contacts to graphene/Pd/Au, the rectification has improved to 270 with an ideality factor of 9. The current density obtained is 1005 Amps/$cm_2$ which is a few orders more than in the previous case.

Figure 9A:
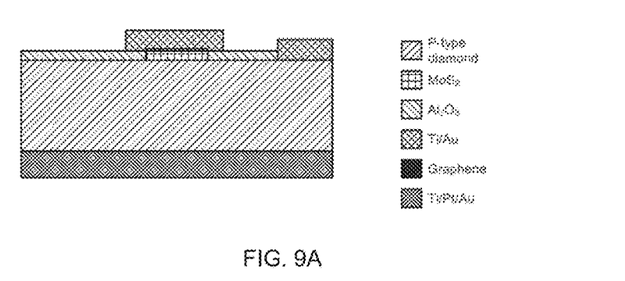
FIG. 9A illustrates a cross-sectional geometry of a pn junction formation with graphene/Pd/Au contacts on $MoS_2$.
Figure 9B:
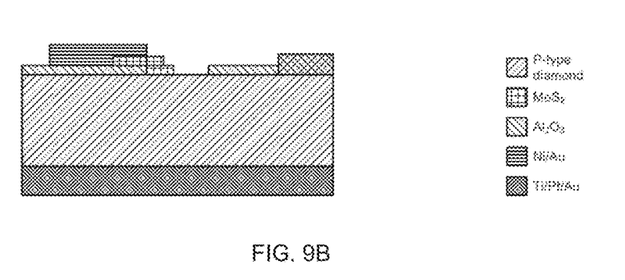
FIG. 9B illustrates a cross-sectional geometry of a pn junction formation with Ni/Au contacts on $MoS_2$.
Figure 10A:
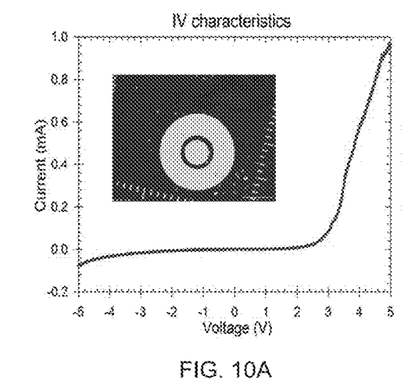
FIG. 10A shows IV characteristics of boron doped NCD/$MoS_2$ pn junction.
Figure 10B:
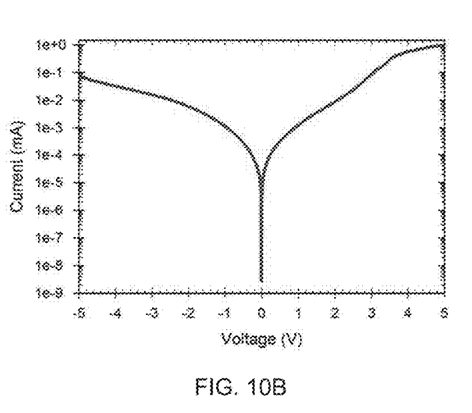
FIG. 10B shows the semi-log plot of IV curves for the device of FIG. 10A.
Figure 11A:
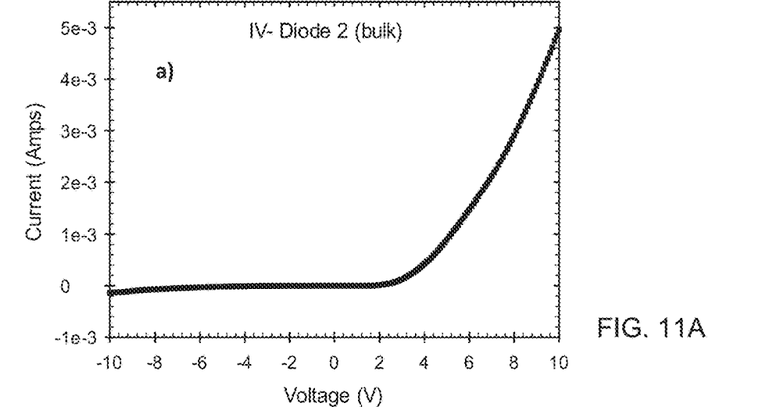
FIG. 11A is a graph of IV characteristics of boron doped SC-CVD diamond/$MoS_2$ pn junction with Ti/Au contracts on $MoS_2$.
Figure 11B:
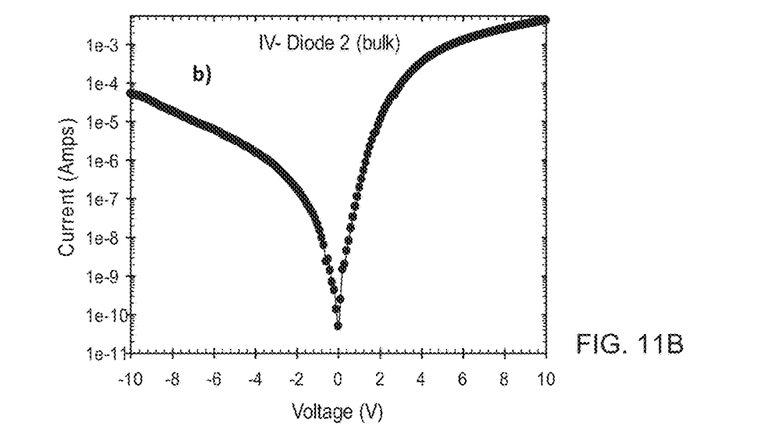
FIG. 11B shows a semi-log plot of IV curves for the device of FIG. 11A.
Figure 11C:
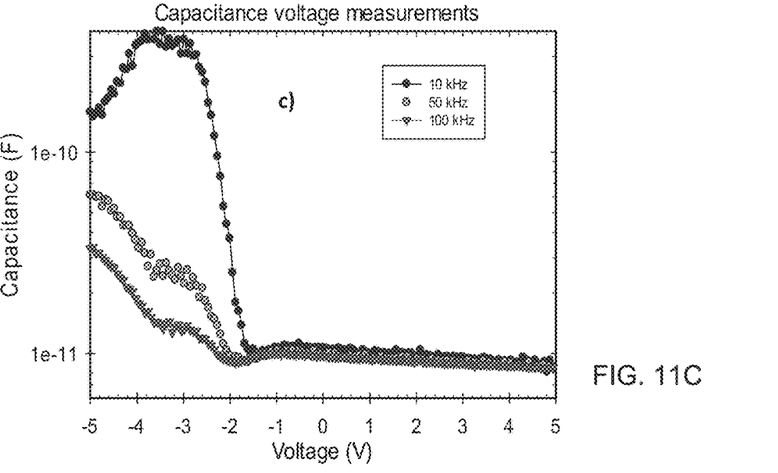
FIG. 11C shows CV curves at different frequencies for the device of FIG. 11A.
Figure 12A:
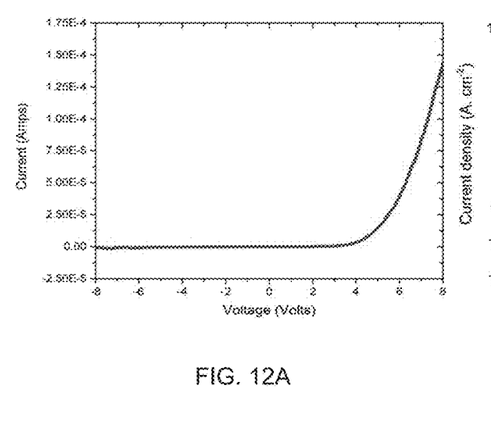
FIG. 12A is a graph of IV characteristics of boron doped SC-CVD diamond/$MoS_2$ pn junction with graphene/Ti/Au contracts on $MoS_2$.
Figure 12B:
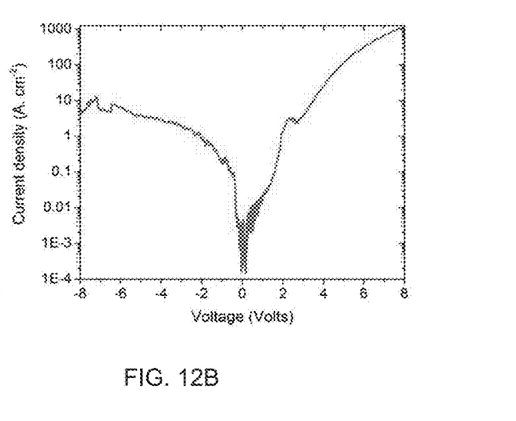
FIG. 12B shows a semi-log plot of IV curves for the device of FIG. 12A.
Figure 13A:
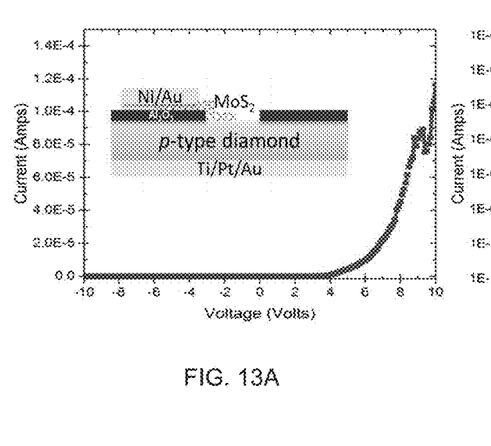
FIG. 13A is a graph of IV characteristics of boron doped SC-CVD diamond/$MoS_2$ pn junction with Ni/Au contracts on $MoS_2$.
Figure 13B:
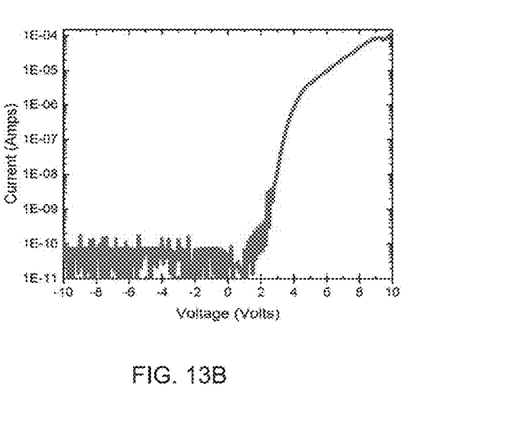
FIG. 13B shows a semi-log plot of IV curves for the device of FIG. 13A.

An additional study of the SC-CVD diamond/$MoS_2$ was done by employing a different geometry and contacts with Ni/Au as shown in FIG. 9B. The rectification ratio has further improved a few orders of magnitude to 10E6, with an ideality factor of 4 and forward current density of 1130 Amps/$cm_2$ at 8 V. Capacitance voltage (CV) measurements of the device from have been performed to look at the doping concentrations and built-in voltage of the device.

Definitions

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method of forming a heterojunction or p-n junction device, comprising:
   providing a base layer including a p-type diamond having a root mean square (RMS) roughness of the less than 10 nms; and
   disposing, by mechanical exfoliation, a 1-10 layers of a transition metal dichalcogenide (TMDC) on at least a portion of the base layer so as to form a TMDC layer and a heterojunction therebetween, wherein the TMDC layer is an n-type layer such that the heterojunction between the p-type diamond base layer and the n-type TMDC monolayer is a p-n junction.

2. The method of claim 1, wherein the TMDC layer includes molybdenum disulfide.

3. The method of claim 1, wherein the p-type diamond base layer includes at least one of an intrinsic or p-type single crystal diamond or a p-type polycrystalline diamond.

4. The method of claim 1, wherein the p-type diamond base layer is doped with boron.

5. The method of claim 1, further comprising:
disposing an insulating layer on the TMDC monolayer and the base layer; and
patterning the insulating layer so as to expose at least a portion of the TMDC monolayer.

6. The method of claim 5, wherein the insulating layer includes at least one of aluminum oxide, hexagonal boron nitride, silicon oxide or silicon nitride.

7. The method of claim 5, further comprising: disposing a conducting layer on at least a portion of the base layer and the exposed portion of the TMDC monolayer so as to form electrical contacts with each of the base layer and the TMDC monolayer.

8. The method of claim 7, wherein the conducting layer includes at least one of nickel, titanium, gold, platinum, 1T phase molybdenum disulfide and graphene.

9. A p-n junction device, comprising:
a base layer comprising a p-type diamond having a root mean square (RMS) roughness of the less than 10 nms; and
a monolayer or few layer of a transition metal dichalcogenide (TMDC) disposed on at least a portion of the base layer forming a TMDC layer, the TMDC layer and the p-type diamond forming a heterojunction therebetween,
an electrical contact pad physically contacting and electrically coupled to each of the base layer and the TMDC layer;
wherein the TMDC layer is an n-type layer so that the heterojunction is a p-n junction.

10. The p-n junction device of claim 9, wherein the base layer and at least a portion of the TMDC layer is coated with an insulating layer.

11. The p-n junction device of claim 10, wherein the insulating layer includes at least one of aluminum oxide, hexagonal boron nitride, silicon oxide or silicon nitride.

12. The p-n junction device of claim 9, wherein the base layer is positioned on a substrate.

13. The p-n junction device of claim 9, wherein the p-type diamond includes at least one of an intrinsic or p-type single crystal diamond or a p-type polycrystalline diamond.

14. The p-n junction device of claim 9, wherein the TMDC layer includes molybdenum disulfide.

15. A method of forming a p-n junction device, comprising;
providing a base layer including a p-type diamond having a root mean square (RMS) roughness of the less than 10 nm;
disposing at least one layer and at most 10 layers of a metal dichalcogenide (TMDC) on at least a portion of the base layer to form a TMDC layer having a heterojunction with the base layer;
disposing an insulating layer on the TMDC layer and the base layer;
patterning the insulating layer so as to expose at least a portion of the TMDC layer;
disposing a masking layer over the insulating layer and the TMDC layer;
patterning the masking layer so as to expose at least a portion of the TMDC layer and the base layer;
disposing a conducting layer on the masking layer so as to contact the exposed portion of the TMDC layer and the base layer; and
removing the masking layer thereby removing only a portion of the conducting layer disposed on the masking layer,
wherein the TMDC layer is an n-type layer such that the heterojunction between the p-type diamond base layer and the n-type TMDC layer is a p-n junction.

16. The method of claim 15, wherein the TMDC layer includes a molybdenum disulfide.

17. The method of claim 15, wherein the p-type diamond includes at least one of an intrinsic or p-type single crystal diamond or a p-type polycrystalline diamond.

18. The method of claim 15, wherein the TMDC layer is formed on the portion of the base layer using chemical vapor deposition.

* * * * *